United States Patent [19]

Mochizuki et al.

[11] Patent Number: 5,160,984
[45] Date of Patent: Nov. 3, 1992

[54] AMPLIFYING FEEDBACK FET SEMICONDUCTOR ELEMENT

[75] Inventors: Mitsuru Mochizuki; Tadashi Takagi; Shuji Urasaki, all of Kamakura, Japan

[73] Assignee: Mitsubishi Denki Kabushiki Kaisha, Japan

[21] Appl. No.: 732,934

[22] Filed: Jul. 19, 1991

Related U.S. Application Data

[63] Continuation of Ser. No. 485,171, Feb. 26, 1990, abandoned.

[30] Foreign Application Priority Data

Mar. 17, 1989 [JP] Japan .................................. 1-66901

[51] Int. Cl.⁵ ............................................ H01L 29/812
[52] U.S. Cl. ..................................... 257/277; 257/280; 257/287
[58] Field of Search .............................. 357/22 H, 22 I; 330/277, 291–294; 307/277, 307

[56] References Cited

U.S. PATENT DOCUMENTS 4,760,350  7/1988  Ayasli .................................. 330/277
4,786,881  11/1988  Eron et al. ............................ 357/51

FOREIGN PATENT DOCUMENTS 58-092271  6/1983  Japan .................................. 357/22 H
58-092272  6/1983  Japan .................................. 357/22 H
60-237709  11/1985  Japan .................................. 357/22 H
62-159907  7/1987  Japan .................................. 357/22 H

OTHER PUBLICATIONS

Edwards, *Foundation for Microstrip Circuit Design*, pp. 17–29, 34–47, 51–65, 80–95, ©1981.
Compton, *Solid State Microwave Devices and Circuit II*, pp. 36–49, ©Jan. 1989.
Ramo et al., *Fields & Waves in Communication Electronics*, pp. 407–411, ©1984.
Pengelly, *Microwave Field-Effect Transistors-Theory, Design and Application*, copyright 1982, pp. 78–79.

*Primary Examiner*—William D. Larkins
*Attorney, Agent, or Firm*—Wolf, Greenfield & Sacks

[57] ABSTRACT

In an amplifying feedback-type FET semiconductor element for use as a wide-band microwave amplifier in telecommunications system such as a radar, a monolithic IC feedback circuit is located between at least two parallel FET cells of an FET semiconductor element and also between gate and drain lead electrodes of the FET semiconductor element. The feedback circuit includes at least two connecting lines and at least one passive element and is connected to the two lead electrodes. With this arrangement, it is possible to reduce the total length of said connecting lines to a minimum, thus guaranteeing a frequency characteristic showing a flat gain over a wide band.

12 Claims, 4 Drawing Sheets

AMPLIFYING FEEDBACK FET SEMICONDUCTOR ELEMENT

This application is a continuation of application Ser. No. 485171, filed Feb. 26, 1990 now abandoned.

BACKGROUND OF THE INVENTION

1. Field of the Invention:

This invention relates to an amplifying FET (Field Effect Transistor) semiconductor element equipped with a feedback circuit for a monolithic IC. More particularly the invention relates to an amplifying feedback-type FET semiconductor element having a wide-band frequency characteristic and adapted to be used in communications systems such as radar.

2. Description of the Related Art:

In modern communications systems, GaAs FETs are widely used as semiconductor elements for microwave amplifiers which are low-noise and high-gain.

Especially in recent years, this kind of wide-band amplifier using FETs has been further developed into a GaAs monolithic IC form. In such development, since resistors can be easily produced from GaAs, a wide-band amplifier can be accomplished by providing the GaAs FET with a negative feedback by the resistor.

FIG. 5 of the accompanying drawings is a circuit diagram showing a typical conventional feedback-type field-effect-transistor amplifier (hereinafter called "feedback-type FET amplifier") disclosed in a thesis publication MW80-80 entitled "GaAs Monolithic IC Ultrawide-band Low-noise Amplifier" (by Nishiuma et al.) issued from The Institute of Electronics, Information and Communication Engineers.

In FIG. 5, 1 designates a field effect transistor (hereinafter called "FET") which has a gate terminal 2, a drain terminal 3 and a source terminal 4. The source terminal 4 is connected to the ground. The gate and drain terminals 2, 3 of the FET 1 are connected by a feedback circuit 8 composed of a resistor 5, a capacitor 6 and connecting transmission lines 7.

Thus this feedback circuit 8, as shown in FIG. 5, includes passive elements, i.e. the resistor 5 and the capacitor 6, and the connecting transmission lines 7.

In this circuit, the impedance $Z_f$ of the feed-back circuit 8 is expressed by the following equation:

$$Z_f = R_f + j(\omega L_f - 1/\omega C_f) \ldots \quad (1)$$

where $R_f$ is the value of the resistor 5, $C_f$ is the value of the capacitor 6, and $L_f$ is the value of the inductance of the connecting transmission lines 7.

In a feedback-type FET amplifier using such FET semiconductor elements, if the value $C_f$ of the capacitor 6 is determined to be sufficiently large and also if the value $L_f$ of the connecting transmission line 7 is determined to be sufficiently small, the second term $j(\omega L_f - 1/\omega C_f)$ on the right side of the equation (1) above is negligible, compared with the first term $R_f$ on the right side, in a desired frequency band. Therefore if the impedance $Z_f$ of the feedback circuit 8 is appropriated to the value $R_f$ of the resistor 5 ($Z_f = R_f$) and if a most suitable value is selected for the value $R_f$ of the resistor 5, this amplifier can have good input and output reflection characteristics over a wide frequency band and also a frequency characteristic showing a flat gain over a wide frequency band.

FIG. 6 is a chip pattern diagram showing one example of the conventional amplifying feedback-type FET semiconductor element of FIG. 5.

In this conventional amplifying feedback-type FET semiconductor element, as shown in FIG. 6, if the gate width of the FET 1 is increased in an effort to obtain a high output, the distance between the drain and gate terminals 3, 2 of the FET 1 is increased so that the connecting transmission lines 7 of the feedback circuit 8 become elongated. Consequently, the inductance $L_f$ of the connecting transmission lines 7 cannot be neglected so that the impedance $Z_f$ of the feedback circuit 8 depends on the frequency. Therefore, with the frequency characteristic of the conventional amplifier, it is difficult to obtain a flat gain over a wide frequency band.

SUMMARY OF THE INVENTION

It is therefore an object of this invention to provide an amplifying feedback-type FET semiconductor element having a frequency characteristic which gives a high output and a flat gain over a wide band as the impedance of a feedback circuit does not depend on the frequency.

According to this invention, an amplifying feedback-type FET semiconductor element comprising: an FET transistor element including a plurality of parallel FET cells each composed of a semiconductor substrate, and source, drain and gate electrodes mounted on the substrate; a drain lead electrode extending from the drain electrode of each of the FET cells and disposed on substrate at one side of the FET semiconductor element; a gate lead electrode extending from the gate electrode of each of the FET cells and disposed on the substrate at the other side of the FET semiconductor element; and a feedback circuit including at least two connecting lines and at least one passive element and being connected to the drain lead electrode and the gate lead electrode, the feedback circuit being located between the drain and gate lead electrodes and also between the FET cells so as to reduce the total length of the connecting lines to a minimum.

With this arrangement, since the feedback circuit is located between the FET cells and between the drain and gate lead electrodes, it is possible to reduce the total length of the connecting lines to a minimum.

Therefore since it is possible to reduce the inductance component of the connecting lines to thereby approximate this impedance to a feedback resistance, a negative feedback can be achieved stably. As a result, an amplifying action having a flat-gain frequency characteristic can be obtained over a wide frequency band.

The above and other advantages, features and additional objects of this invention will be manifest to those versed in the art upon making reference to the following detailed description and the accompanying drawings in which three structural embodiments incorporating the principles of this invention are shown by way of illustrative example.

DETAILED DESCRIPTION

Figure 1:
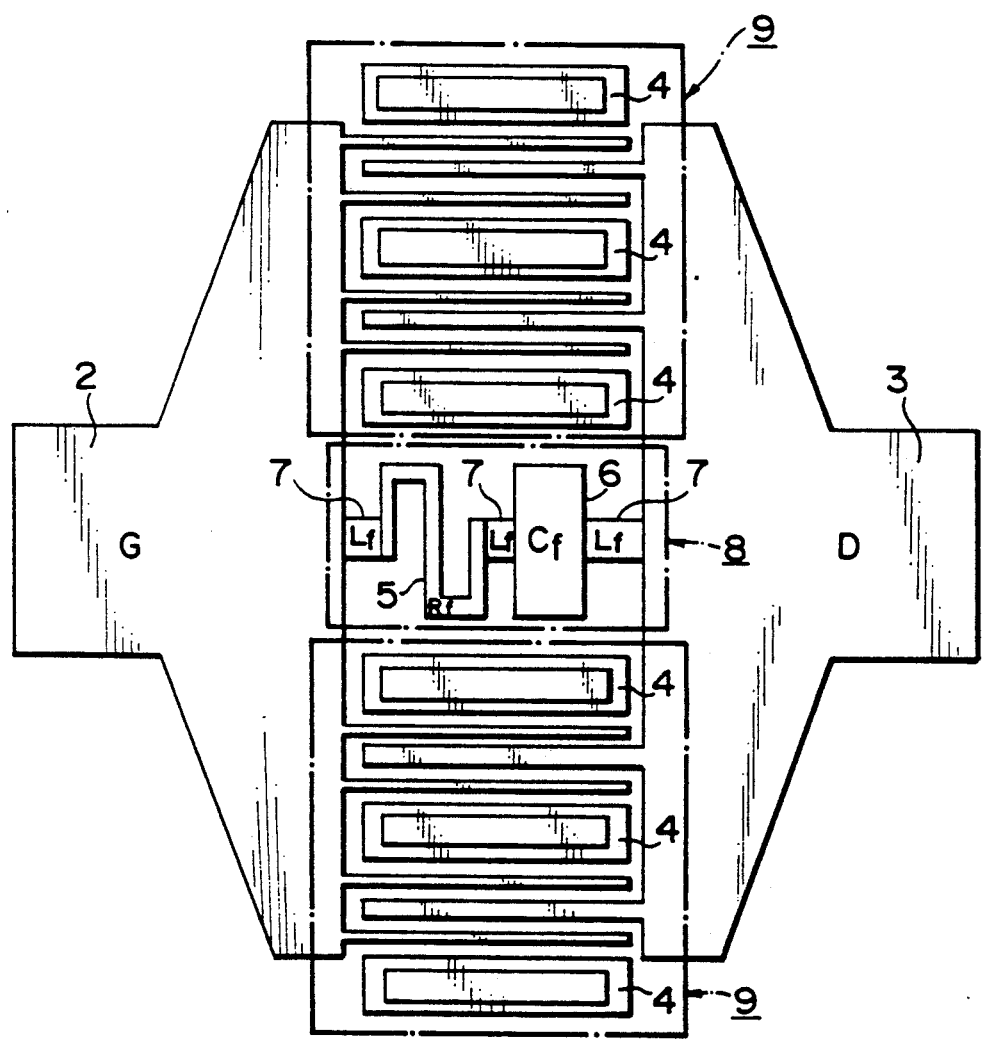
FIG. 1 is a chip pattern diagram showing an amplifying feedback-type FET semiconductor element of this invention.
Figure 2:
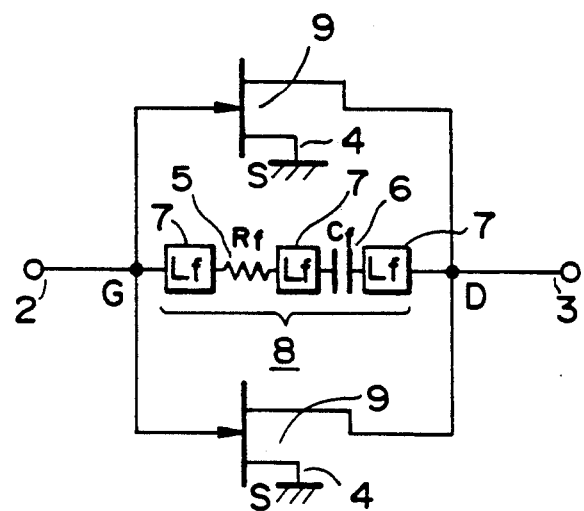
FIG. 2 is a circuit diagram showing a first embodiment of the feedback-type FET semiconductor element of FIG. 1.

FIGS. 1 and 2 show an amplifying feedback-type FET semiconductor element according to a first embodiment of this invention. This feedback-type FET semiconductor element is particularly useful when used as an amplifier.

The amplifier generally comprises a gate terminal 2, a drain terminal 3, a feedback circuit 8 connected to the gate and drain terminals 2, 3, and two FET cells 9. All of these components are mounted on a semiconductor substrate.

Each of the FET cells 9 is composed of source, drain and gate electrodes. The gate terminal 2 is a gate lead electrode disposed on the substrate and extends from the gate electrode. The drain terminal 3 is a drain lead electrode disposed on the substrate and extends from the gate electrode.

The feedback circuit 8 is connected in series to said gate and drain terminals 2, 3 and is located between the two FET cells 9, 9. The feedback circuit 8 is composed of connecting transmission lines 7, and passive elements, i.e. a capacitor 6 and a resistor 5.

Each of the gate and drain terminals 2, 3, as shown in FIG. 1, has a comb-shaped contour. The gate terminal 2 and the drain terminal 3 are disposed in confronting relationship. Between the two terminals 2, 3 is disposed, the source terminals 4 and the feedback circuit 8.

FIG. 2 shows an equivalent circuit corresponding to the chip pattern diagram of FIG. 1. In FIG. 2, the two FET cells 9, 9 are connected in parallel. This amplifier is constituted by connecting the feedback circuit 8 in parallel to the two FET cells 9, i.e. FET semiconductor elements. Specifically, the feedback circuit 8 is located between the two FET cells 9, 9 and is connected at one end to the drain terminal 3, i.e. the drain lead electrode, and at the other end to the gate terminal 2, i.e. the gate lead electrode. The feedback circuit 8 is composed of the resistor 5, the capacitor 6 and the connecting transmission lines 7, which components are all connected in series.

Since the FET semiconductor element, as shown in FIG. 1, is divided into two parallel FET cells 9, 9, the feedback circuit 8 of this amplifier can be located between these two FET cells 9, 9 so that the feedback circuit 8 can be formed on the shortest path between the gate and drain terminals 2, 3. As a result, it is possible to reduce the total length of the connecting transmission lines 7 of the feedback circuit 8 to a minimum. Because of this sufficiently short length of the connecting lines 7, the inductance $L_f$ can be almost neglected.

Since the inductance $L_f$ (in the equation (1)) of the connecting transmission lines 7 can be reduced to a sufficiently small value, it is possible to obtain an approximate to $Z_f = R_f$ ($R_f$ is a value of the resistor 5) by increasing the value $C_f$ of the capacitor 6 sufficiently.

Therefore the impedance $Z_f$ of the feedback circuit 8 can be kept constant, irrespective of the frequency.

Consequently, as a suitable value is selected for $R_f$ of the resistor 5, it is possible to obtain good input and output reflection characteristics and also a flat gain over a wide frequency band.

Figure 3:
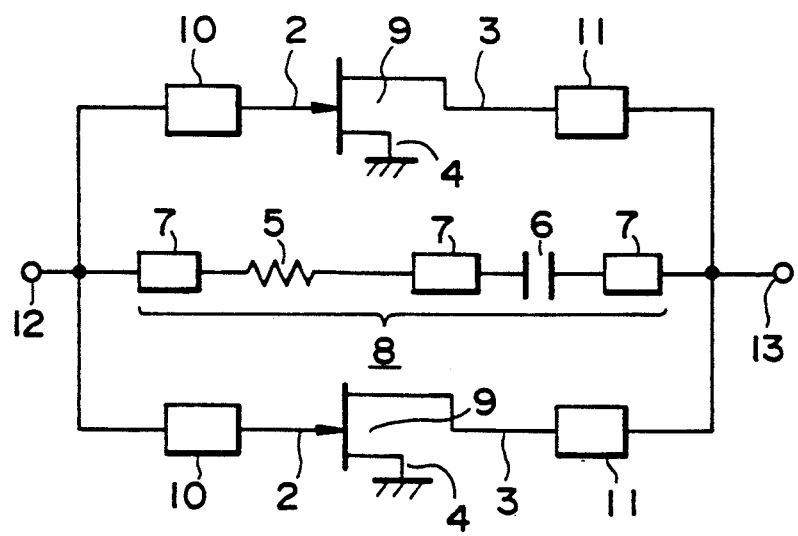
FIG. 3 is a circuit diagram showing a second embodiment in which the feedback-type FET semiconductor element is equipped with input and output circuits.

FIG. 3 shows an amplifying feedback-type FET semiconductor element according to a second embodiment. This feedback-type FET semiconductor element comprises the feedback circuit 8 and two FET cells 9, 9, each including input and output side circuits 10, 11. These two FET cells 9, 9 and the feedback circuit 8 are connected in parallel to one another.

Thus the feedback circuit 8 is connected between the input terminal 12 to, which the input side circuit 10 is added to the gate terminals of the FET cells 9, and the output terminal 13 to, which the output side circuit 11 is added to the drain terminals of the FET cells 9.

In this embodiment also, the same results as in the first embodiment can be achieved.

Figure 4:
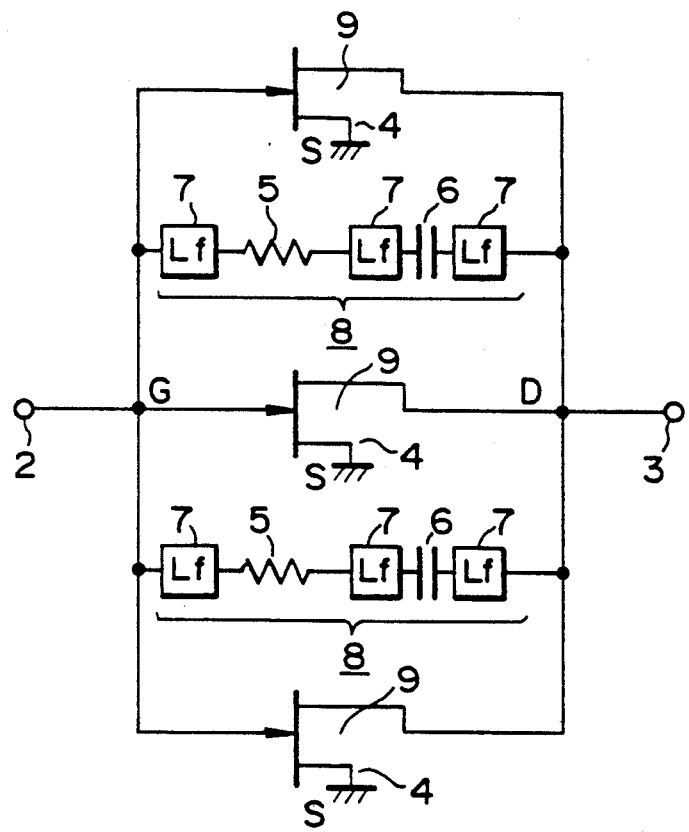
FIG. 4 is a circuit diagram showing a third embodiment in which the feedback-type FET semiconductor element includes three parallel FET cells.
Figure 5:
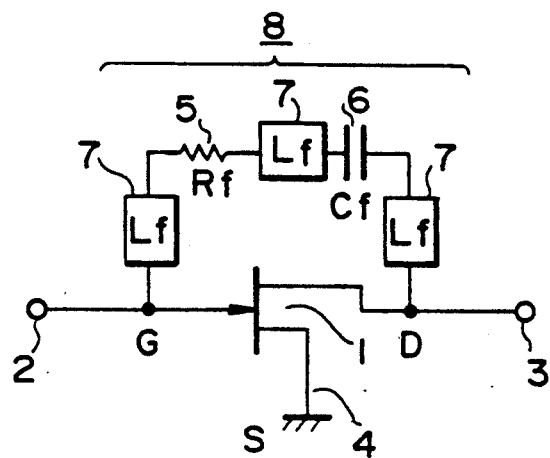
FIG. 5 is a circuit diagram showing a conventional amplifying feedback-type FET semiconductor element.
Figure 6:
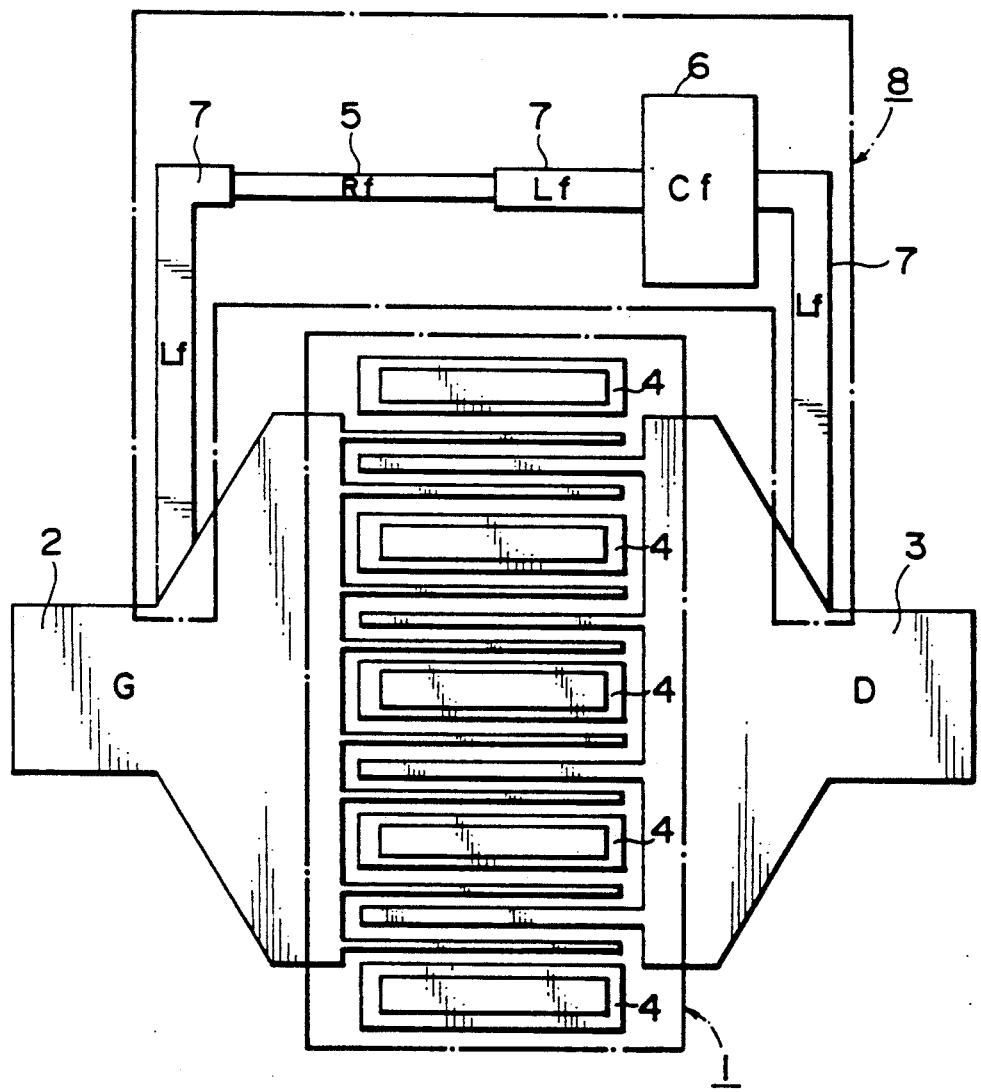
FIG. 6 is a chip pattern diagram showing the conventional feedback-type FET semiconductor element of FIG. 5.

FIG. 4 shows a third embodiment, in which a multiplicity of FET cells 9 (three FET cells in this embodiment) are connected in parallel and in which a plurality of feedback circuits 8 (two feedback circuits in this embodiment) are located one between each adjacent two of the FET cells 9, 9.

Also in this embodiment, the same operation and results as in the foregoing embodiments can be obtained. Further, with this multi-feedback-circuit arrangement, a large-scale integration and hence a large-scale integrated circuit can be achieved.

As discussed above, according to the amplifying feedback-type FET semiconductor element, since at least one feedback circuit is located between two or more FET cells and between the drain lead electrode and the gate lead electrode, it is possible to reduce the total length of connecting transmission lines to a minimum even if the amplifying FET semiconductor element having a large gate width is equipped with the feedback circuit, thus guaranteeing a frequency characteristic showing a flat gain over a wide frequency band.

What is claimed is:

1. An amplifying feedback-type FET semiconductor element comprising:
   (a) first and second FET transistor elements each including a plurality of substantially planar parallel FET cells disposed on a semiconductor substrate, and including source, drain and gate electrodes mounted on said substrate, each of the first and second FET transistor elements also having an input end and an output end;
   (b) a drain lead electrode extending from said drain electrode of each said FET cell and disposed on said substrate at the respective output end of said first and second FET transistor elements;
   (c) a gate lead electrode extending from said gate electrode of each said FET cell and disposed on said substrate at the respective input end of said first and second FET transistor elements; and
   (d) a feedback circuit coupled between said gate lead electrode and said drain lead electrode comprising at least one passive element, a first connecting line coupling between said gate lead electrode and said at least one passive element, a second connecting line coupling between said at least one passive element and said drain lead electrode, said feedback circuit disposed in substantially the same plane as said first and second FET transistor elements, said gate lead electrode, and said drain lead electrode, and said feedback circuit additionally disposed between said first and second FET transistor elements;

whereby the total length of said connecting lines is reduced to a minimum.

2. An amplifying feedback-type FET semiconductor element according to claim 1, wherein said at least one passive element comprises a resistor.

3. An amplifying feedback-type FET semiconductor element according to claim 1, wherein said at least one passive element comprises a resistor and a capacitor in connected series.

4. An amplifying feedback-type FET semiconductor element according to claim 1, further comprising an input circuit connected in series between said gate lead electrode and at least one of said first and second FET transistor elements, and an output circuit connected in series between said at least one of said first and second FET transistor elements and said drain lead electrode.

5. An amplifying feedback-type FET semiconductor element according to claim 4, wherein said at least on passive element comprises a resistor.

6. An amplifying feedback-type FET semiconductor element according to claim 4, wherein said at least on passive element comprises a resistor and a capacitor connected in series.

7. AN amplifying feedback-type FET semiconductor element according to claim 1, wherein each of said drain and gate lead electrodes has a generally comb-shaped contour.

8. An amplifying feedback-type FET semiconductor element according to claim 7, wherein said at least one passive element comprises a resistor.

9. An amplifying feedback-type FET semiconductor element according to claim 7, wherein said at least one passive element comprises a resistor and a capacitor connected in series.

10. An amplifying feedback-type FET semiconductor element according to claim 7, further comprising an input circuit connected from said gate lead electrode to at least one of said first and second FET transistor elements, and an output circuit connected from said at least one of said first and second FET transistor elements to said drain lead electrode.

11. An amplifying feedback-type FET semiconductor element comprising:
(a) first and second FET transistor elements each including a plurality of substantially planar parallel FET cells disposed on a semiconductor substrate, and including source, drain and gate electrodes mounted on said substrate, each of the first and second FET transistor elements also having an input end and an output end;
(b) a drain lead electrode extending from said drain electrode of each said FET cell and disposed on said substrate at the respective output end of said first and second FET transistor elements;
(c) a gate lead electrode extending from said gate electrode of each said FET cell and disposed on said substrate at the respective input end of said first and second FET transistor elements; and
(d) a feedback circuit coupled between said gate lead electrode and said drain lead electrode comprising at least one passive element, a first connecting line coupling between said gate lead electrode and said at least one passive element, a second connecting line coupling between said at least one passive element and said drain lead electrode, said feedback circuit also being mounted on said semi-conductor substrate, said feedback circuit furthermore being disposed between said first and second FET transistor elements;

whereby the total length of said connecting lines is reduced to a minimum.

12. An amplifying feedback-type FET semiconductor element comprising:
(a) first and second FET transistor elements each including a plurality of substantially planar parallel FET cells disposed on a semiconductor substrate, and including source, drain and gate electrodes mounted on said substrate, each of the first and second FET transistor elements also having an input end and an output end;
(b) a drain lead electrode extending from said drain electrode of each said FET cell and disposed on said substrate at the respective output end of said first and second FET transistor elements;
(c) a gate lead electrode extending from said gate electrode of each said FET cell and disposed on said substrate at the respective input end of said first and second FET transistor elements; and
(d) a feedback circuit coupled between said gate lead electrode and said drain lead electrode comprising at least one passive element, a first connecting line coupling between said gate lead electrode and said at least one passive element, a second connecting line coupling between said at least one passive element and said drain lead electrode, said feedback circuit, in addition to being disposed between said gate and drain lead electrodes, furthermore disposed between said first and second FET transistor elements so that said feedback circuit does not overlie said first and second FET transistor elements;

whereby the total length of said connecting lines is reduced to a minimum.

* * * * *